United States Patent
Yoshimatsu

(10) Patent No.: US 8,341,814 B2
(45) Date of Patent: Jan. 1, 2013

(54) METHODS FOR MANUFACTURING PIEZOELECTRIC DEVICES

(75) Inventor: Masahiro Yoshimatsu, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/016,893

(22) Filed: Jan. 28, 2011

(65) Prior Publication Data

US 2011/0187235 A1   Aug. 4, 2011

(30) Foreign Application Priority Data

Feb. 1, 2010   (JP) ................................ 2010-019880
Mar. 25, 2010  (JP) ................................ 2010-069445

(51) Int. Cl.
*H04R 17/10* (2006.01)
*B32B 37/12* (2006.01)

(52) U.S. Cl. ...... 29/25.35; 29/896.22; 29/417; 310/348; 310/367; 156/307.1

(58) Field of Classification Search ............... 29/25.35, 29/594, 896.22, 417; 310/348, 351, 367, 310/370; 156/153, 307.1
See application file for complete search history.

(56) References Cited

U.S. PATENT DOCUMENTS 6,848,153 B2 * 2/2005 Tsuzuki et al. ............. 29/25.35
7,294,951 B2 * 11/2007 Oouchi et al. ............... 310/348

FOREIGN PATENT DOCUMENTS

| JP | H02-057621 U | 4/1990 |
| JP | 8-167823 | 6/1996 |
| JP | 09-008588 | 1/1997 |
| JP | 10-200368 | 7/1998 |
| JP | 2003-110397 | 4/2003 |
| JP | 2003-243962 | 8/2003 |
| JP | 2003-258583 | 9/2003 |
| JP | 2005-286658 | 10/2005 |
| JP | 2006-148758 | 6/2006 |
| JP | 2007-129326 | 5/2007 |
| JP | 2008035276 A * | 2/2008 |
| JP | 2008-227748 | 9/2008 |

OTHER PUBLICATIONS

Office Action for related Japanese Patent Application No. 2010-069445, 3 pages, Feb. 27, 2012.

* cited by examiner

Primary Examiner — A. Dexter Tugbang
(74) Attorney, Agent, or Firm — Klarquist Sparkman, LLP

(57) ABSTRACT

Methods are provided for manufacturing piezoelectric devices. In an exemplary method, a base wafer is prepared that defines an array of multiple bases. Between each base on the wafer is a through-hole defined in respective parts by the respective edge surfaces of adjacent bases. A piezoelectric wafer is prepared that defines an array of multiple piezoelectric frames each having a piezoelectric vibrating piece and a surrounding frame portion. The vibrating piece includes an excitation electrode and extraction electrode. The extraction electrode extends to the through-hole. An adhesive is applied to a surface of the frame portion including a surface of the extraction electrode. The adhesive bonds the piezoelectric wafer to the base wafer. Excess adhesive is removed from the through-hole to expose a portion of the extraction electrode in the through-hole. An external electrode is formed on the outer surface of the base and extends to the through-hole in which the external electrode covers the edge surface of the through-hole, an edge surface of the adhesive, and the exposed portion of the extraction electrode.

18 Claims, 11 Drawing Sheets

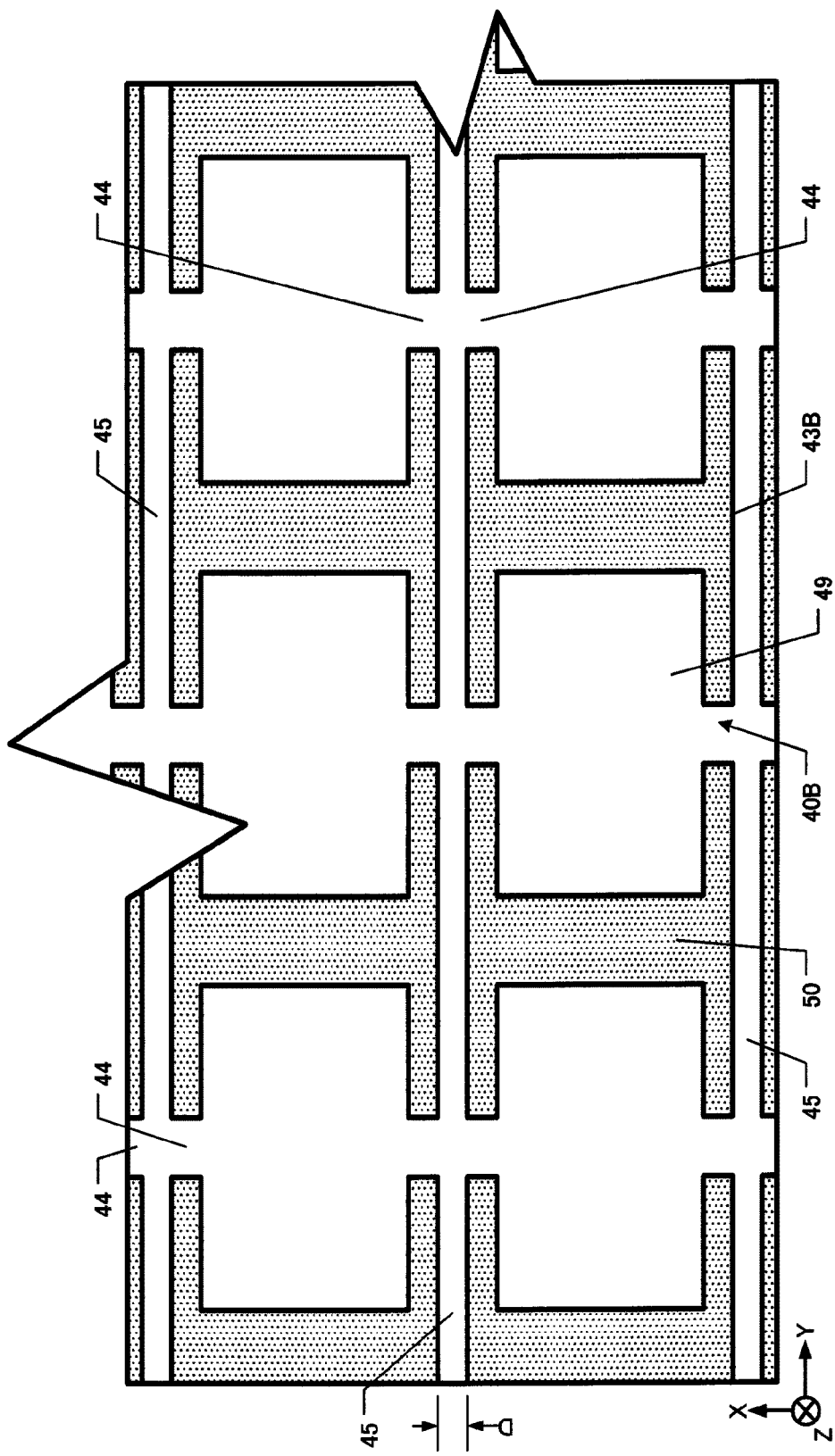

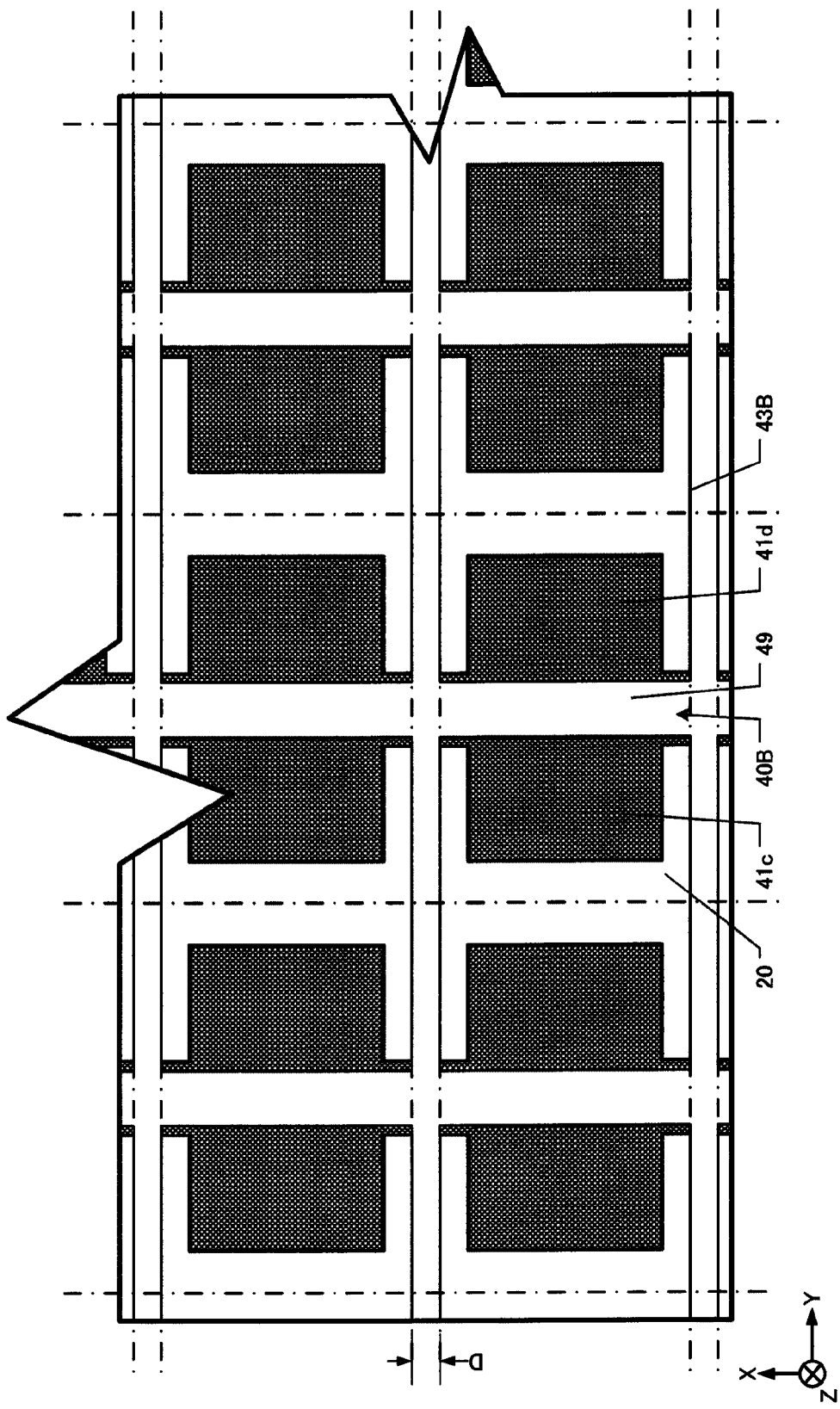

METHODS FOR MANUFACTURING PIEZOELECTRIC DEVICES

CROSS-REFERENCE TO RELATED APPLICATION

This application claims priority to and the benefit of Japan Patent Application No. 2010-019880, filed on Feb. 1, 2010, and Japan Patent Application No. 2010-069445, filed on Mar. 25, 2010, in the Japan Patent Office, the disclosures of which are incorporated herein by reference in their respective entireties.

FIELD

This disclosure relates to, inter alia, piezoelectric devices (e.g., piezoelectric "resonators") comprising a piezoelectric vibrating piece made of a piezoelectric material, such as piezoelectric crystal (e.g., quartz crystal), and to methods for manufacturing such devices.

DESCRIPTION OF THE RELATED ART

Piezoelectric devices, such as piezoelectric vibrators, resonators, and SAW (surface acoustic wave) filters, are usually encased in a package configured for surface-mounting of the devices. In response to needs for price reduction of these devices, various packaging approaches have been proposed, such as use of plastic packages or glass packages. In a plastic or glass package, a crystal frame (including a crystal vibrating piece) is sandwiched between a package base and a lid that are bonded and sealed to the frame using an adhesive. This packaging scheme is disclosed, for example, in Japan Patent Unexamined Application No. 2006-148758. The package also includes external electrodes that are connected inside the package to respective extraction and excitation electrodes of the crystal vibrating piece. These connections are typically by metal films formed inside through-holes in a package component such as in the package base.

Unfortunately, the adhesive normally applied between the crystal frame and lid and base may fail under arid conditions. Also, during manufacture an insufficient amount of adhesive may have been applied between the crystal frame and lid and base to avoid adhesive failure. If the base includes the external electrodes, a failure of the adhesive or an insufficient amount of adhesive often causes a break in conductivity or an actual disconnection of the external electrode.

SUMMARY

Packaged piezoelectric devices (e.g., piezoelectric "resonators") as disclosed herein (and made by methods as disclosed herein) comprise external electrodes that do not become disconnected from the extraction and excitation electrodes inside the package, even if exposed to dry conditions.

An exemplary embodiment of a method for manufacturing a piezoelectric device comprises a step of preparing a base wafer defining multiple bases, wherein each base defines at least one through-hole. Also prepared is a piezoelectric wafer on which are formed multiple piezoelectric frames each including a respective piezoelectric vibrating piece and respective frame portion. Each piezoelectric vibrating piece also includes at least one respective extraction electrode connected to a respective excitation electrode. Each extraction electrode is connected to a respective through-hole during bonding of the piezoelectric wafer to the base wafer. Bonding is achieved using a non-conductive adhesive that is applied to a surface of the frame portion and to the extraction electrode. In a first bonding step the piezoelectric wafer and the base wafer are bonded together by applying the adhesive to the lower surface of the frame portion and to corresponding regions of the upper surface of the base. Excess adhesive is removed in the through-holes so as to reveal the respective extraction electrodes. Then, the external electrodes are formed on the bottom surface of the base wafer in a way that results in their electrical connection to the respective extraction electrodes. The conductive material of the external electrodes is applied to respective portions of the bottom surface, to respective edge surfaces of the through-holes, to respective edge surfaces of the adhesive in the through-holes, and to the respective extraction electrodes.

In certain embodiments the through-holes can be shaped, for example, as respective rectangles as viewed from adjacent the bottom surface of the base wafer. In other embodiments the bottom surface of each base is rectangular, and the respective through-holes extend along three sides of the rectangle.

Removing the excess adhesive can be performed by, for example, sand-blasting or anisotropic etching. Anisotropic etching can involve irradiation by argon ions or exposure to an $O_2$ plasma.

For making complete piezoelectric vibration devices, the method further comprises preparing a lid wafer defining multiple lids. The lid wafer thus formed is aligned with and bonded to the piezoelectric wafer using the adhesive. The resulting structure is a three-wafer sandwich bonded together and defining multiple piezoelectric devices each comprising a respective base, piezoelectric frame, and lid. To remove discrete individual devices from the bonded sandwich, a cutting step is performed.

According to another aspect of the disclosure, piezoelectric devices are provided. An exemplary embodiment of such a device comprises a piezoelectric frame including a piezoelectric vibrating piece and a frame portion. The vibrating piece is connected to the frame portion, which surrounds the vibrating piece, in an integral manner. The piezoelectric frame has a first surface and a second surface opposite the first surface. The first and second surfaces of the frame portion are surfaces to which the non-conductive adhesive is applied. At least one extraction electrode, connected to a respective excitation electrode, extends from the piezoelectric vibrating piece to the frame portion. A lid is bonded to the first surface of the frame portion, and a base is bonded to the second surface of the frame portion, using the adhesive. In certain embodiments, for each extraction electrode the peripheral edge surface of the base defines a corresponding notch or recess located on a respective edge of the base. The extraction electrode on the frame portion conductively extends to the notch. The adhesive is applied so as to extend to edge surface of the respective notch. The adhesive in the notch is trimmed so that the edge surface of the adhesive is co-topographic with the edge surface of the notch, which allows the respective external electrode to be formed on the same surface as the edge surface of the notch.

In certain other embodiments the bottom surface of the base is rectangular in shape, and each through-hole extends along three edges of the base.

The various aspects and embodiments provide piezoelectric devices in which the external electrodes are soundly connected to respective extraction electrodes, which avoids disconnection of these electrodes and provides high-reliability devices. Also provided are methods for manufacturing such devices.

BRIEF DESCRIPTION OF THE DRAWINGS

FIG. 10 is a plan view of the bottom surface of the base wafer after the three wafers have been bonded together in the second embodiment, before the external electrodes have been formed.

FIG. 11 is a plan view of the bottom surface of the base wafer after the external electrodes have been formed.

DETAILED DESCRIPTION

Various representative embodiments are described below with reference to the figures. The described embodiments include, as a piezoelectric device, a piezoelectric resonator comprising a tuning-fork type crystal vibrating piece, for example.

First Embodiment of Piezoelectric Resonator

Figure 1:
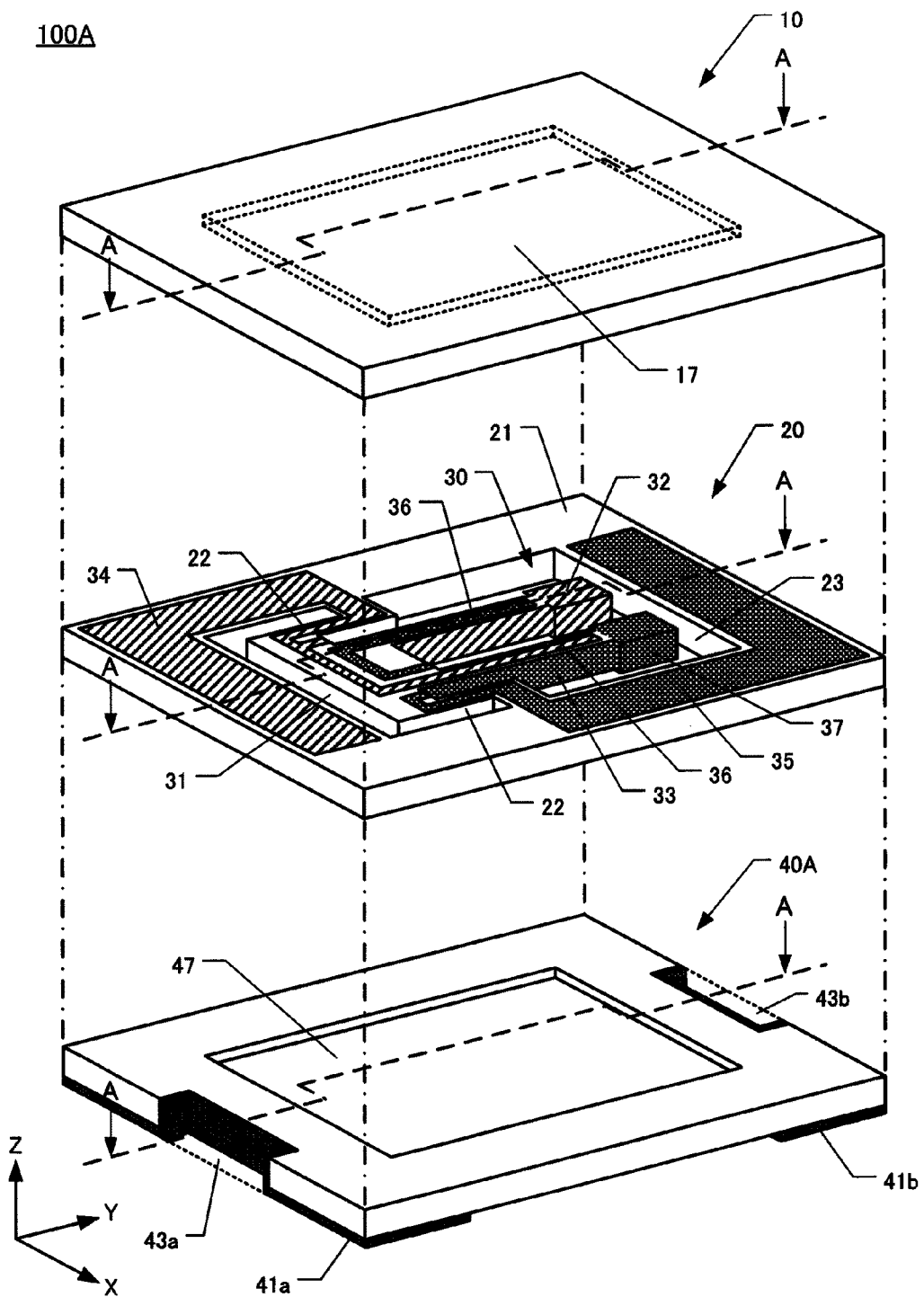
FIG. 1 is an exploded-schematic view of a piezoelectric resonator (piezoelectric vibrating device) according to a first embodiment.

FIG. 1 is an exploded-schematic view of a piezoelectric resonator 100A according to this first embodiment. The surface on which a tuning-fork type piezoelectric vibrating piece is mounted is denoted the XY plane. The pair of vibrating arms of the tuning-fork type piezoelectric vibrating piece 30 extends in the Y-axis direction. The direction perpendicular to the XY plane is the Z-axis direction.

As shown in FIG. 1, the piezoelectric resonator 100A comprises an upper component called a lid 10, a middle component called a crystal frame 20, and a lower component called a base 40A. The lid 10, frame 20, and base 40A are stacked in the manner of a sandwich and bonded together to form the piezoelectric resonator 100A. The lid 10 is made of glass, for example, and has a concavity 17 that faces the crystal frame 20. The base 40A is also made of glass, for example, and has a base concavity 47 that faces the crystal frame 20. Thus, the two concavities 17, 47 face each other.

The crystal frame 20 comprises a tuning-fork type crystal vibrating piece 30 located centrally, an outer frame portion 21 that surrounds the vibrating piece 30, and a pair of supporting arms 22 connecting the tuning-fork type crystal vibrating piece 30 to the outer frame portion 21. A space 23 is defined between the tuning-fork type crystal vibrating piece 30 and the outer frame portion 21. The space 23 defines the profile of the tuning-fork type crystal vibrating piece 30 and is formed by etching. The tuning-fork type crystal vibrating piece 30 has the same thickness as the outer frame portion 21 and the supporting arms 22.

The tuning-fork type crystal vibrating piece 30 also includes a base portion 31 extending in the −Y-axis direction and having a rectangular shape when viewed from the Z-axis direction. The pair of vibrating arms 32 extends in the +Y-axis direction from one end of the base portion 31. Each vibrating arm 32 has a rectangular shape and includes a respective external electrode 33 formed on the top, bottom, and both side surfaces of the arm. Note that only the upper surface and one side surface of the tuning-fork type crystal vibrating piece 30 are depicted in the figure. A respective groove 36, extending in the Y-axis direction, is defined on each of the top and the bottom surfaces of each vibrating arm 32. Forming an excitation electrode in a groove 36 increases the electrical field generated on the vibrating arms 32, which suppresses increases of the CI (crystal impedance) of the vibrating piece 30. On the +Y distal end of each vibrating arm 32 is a weight 37 that makes the pair of vibrating arms 32 of the tuning-fork type crystal vibrating piece 30 oscillate well and also allows for frequency adjustment. The tuning-fork type crystal vibrating piece 30 is very small, and usually vibrates at a frequency of 32.768 kHz.

Extraction electrodes 34, 35 extend from the supporting arms 22 to the outer frame portion 21 on the top and the bottom surfaces of the crystal frame 20. The extraction electrode 34 extends from the −Y side to the base portion 31, and the extraction electrode 35 extends from the +Y side to the base portion 31. The extraction electrodes 34, 35 are electrically connected to the respective excitation electrodes 33 formed on the vibrating arms 32.

The excitation electrode 33 and extraction electrodes 34, 35 each comprises a gold (Au) layer of 400 Å to 2000 Å thickness formed on a chromium (Cr) layer of 150 Å to 700 Å thickness. As an alternative to Cr, titanium (Ti) or nickel (Ni) can be used, and silver (Ag) may be used instead of Au.

The supporting arms 22 reduce oscillation leakage from the vibrating arms 32 to outside the piezoelectric resonator 100A. The supporting arms 22 also reduce adverse effects of temperature changes or physical impacts occurring outside the "package." The package is an enclosure collectively formed by the lid 10, the outer frame portion 21 of the crystal frame 20, and the base 40A.

On the −Y edge of the base 40A is a respective notch 43a, and on the +Y edge of the base 40A is a respective notch 43b. The notches 43a, 43b form respective parts of respective through-holes 43A (see FIG. 5) at the Y-conjunctions of adjacent bases formed on a base wafer 40W (see FIG. 5). The two notches 43a, 43b are situated adjacent (and facing) each other in a respective through-hole 43A (see FIG. 5) so that the Y-direction depth of each notch 43a, 43b on the XY plane is half the Y-dimension of the respective through hole 43A (see FIG. 5).

On the under-surface 49 of the base 40A adjacent the −Y edge of the base 40A is a first external electrode 41a. Similarly, on the under-surface 49 of the base 40A adjacent the +Y edge of the base 40A is a second external electrode 41b. A part of the first external electrode 41a extends in the +Z direction into the notch 43a to cover the edge surface 40p of the notch 43a. In a similar manner, a part of the second external electrode 41b extends in the +Z direction into the notch 43a to cover the edge surface 40p of the notch 43b. The external electrodes 41a and 41b are connected to respective extraction electrodes 34 and 35 on the crystal frame 20.

Each external electrode 41a, 41b comprises a layer of gold (Au) having a thickness of 400 Å to 2000 Å formed on a layer of chromium (Cr) having a thickness of 150 Å to 700 Å and exhibiting very good adhesion to glass. Alternatively to Cr, a layer of nickel (Ni) or titanium (Ti) may be used. Alternatively to Au, a layer of silver (Ag) may be used.

Figure 2:
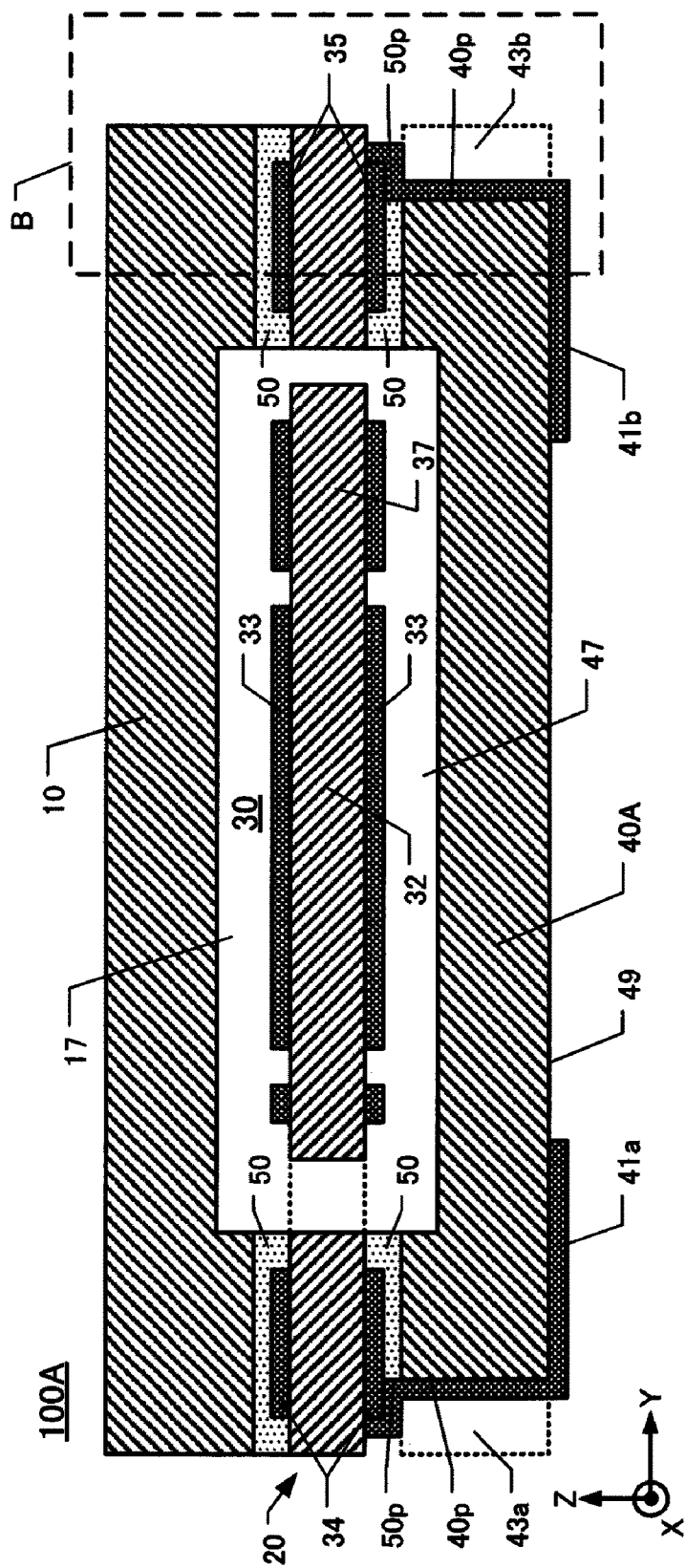
FIG. 2 is an elevational section along the line A-A in FIG. 1 of the first embodiment of a piezoelectric resonator.

Bonding together the lid 10, crystal frame 20, and base 40A, is described with reference to FIG. 2, which is an elevational section of the piezoelectric resonator 100A along the line A-A in FIG. 1. Since the notches 43a and 43b are formed on respective edges of the base 40A and extend in the Y-axis direction, the length of the base 40A in the Y-axis direction along the line A-A is less than of the lid 10 and crystal frame 20. A first extraction electrode 34 is situated on the upper and lower surfaces of the −Y side of the crystal frame 20; a second extraction electrode 35 is situated on the upper and lower surfaces of the +Y side of the crystal frame 20. Thus, before the respective external electrodes 41a, 41b are formed (after bonding together the base 40A and crystal frame 20), the extraction electrodes 34, 35 extend to regions on the under-surface of the crystal frame 20 exposed in the respective notches 43a, 43b.

The lid 10 and the crystal frame 20 are bonded together using a non-conductive adhesive 50. The crystal frame 20 and base 40A are bonded together using the non-conductive adhesive 50. The external electrodes 41a, 41b are formed on respective regions of the base 40A. The external electrodes 41a, 41b are formed by sputtering or vacuum deposition so as to cover respective regions of the under-surface 49 of the base 40A, respective edge surfaces 40p of the notches 43a, 43b, respective edge surfaces 50p of the non-conductive adhesive 50, and respective extraction electrodes 34, 35. The external electrodes 41a, 41b are electrically connected to respective extraction electrodes 34, 35 by overlapping them.

As the non-conductive (i.e., non-conductive in the electrical sense) adhesive 50, a polyimide adhesive or epoxy adhesive can be used. Alternatively to using an adhesive, the crystal frame 20 and base 40A can be bonded together using anodic bonding or siloxane bonding.

Figure 3:
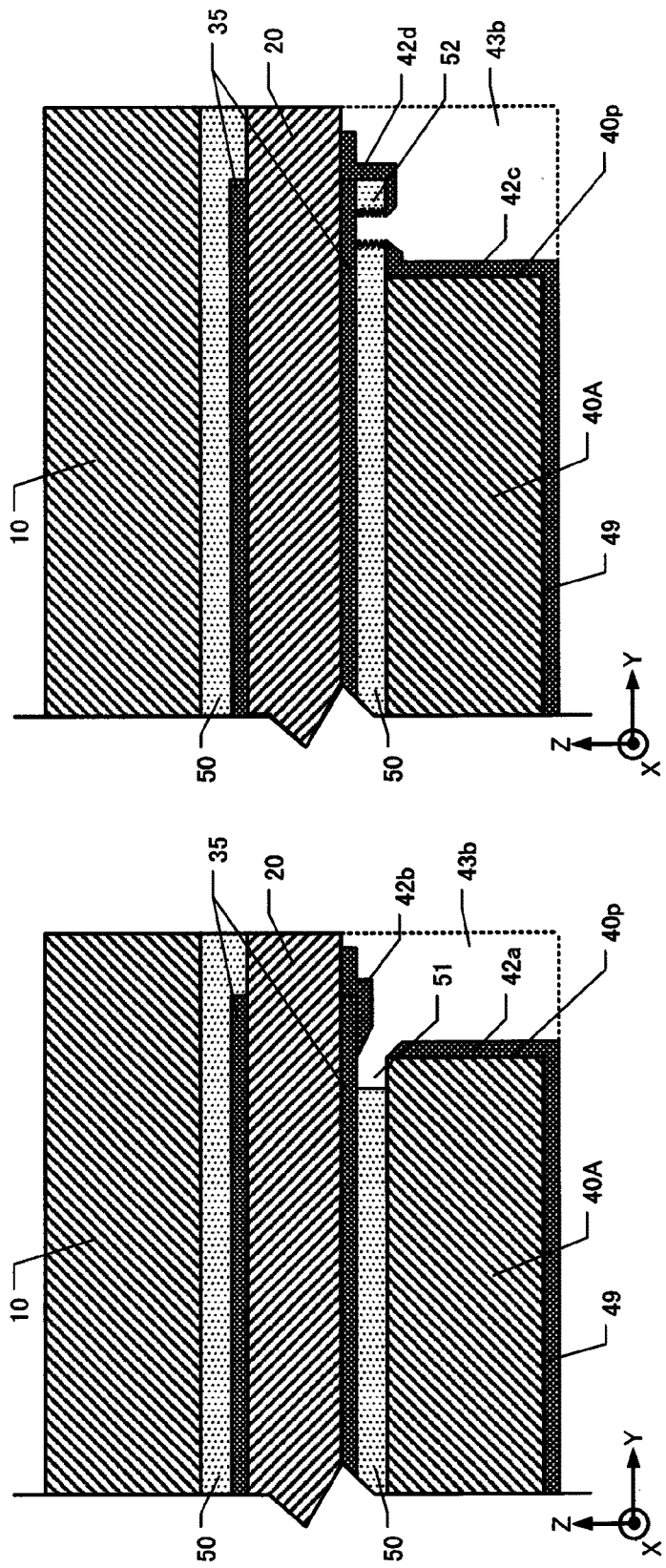
FIG. 3A shows an undesirable situation in which the edge of the adhesive does not extend to the edge surface (in the Y-axis direction) of the base.
FIG. 3B shows another undesirable situation in which the non-conductive adhesive extends past the edge surface (in the Y-axis direction) of the base.

The edge surfaces 50p of the notches 43a, 43b in the vicinity of the non-conductive adhesive 50, applied between the crystal frame 20 and the base 40A, are contiguous with the edge surfaces 40p of the notches 43a, 43b. As a result, the extraction electrodes 34, 35 and respective external electrodes 41a, 41b are firmly connected together electrically without any disconnection. The reason is explained by referring to FIG. 3.

FIGS. 3A and 3B show respective situations in which the extraction electrode 35 and respective external electrode 41b are not electrically connected with each other due to faults involving the non-conductive adhesive 50. Each figure is an enlarged view of the region enclosed within the region "B" denoted by a dashed line in FIG. 2. In the situation shown in FIG. 3A the amount of non-conductive adhesive 50 is insufficient for covering the edge surface 40p of the notch 43b. In the situation shown in FIG. 3B the amount of non-conductive adhesive 50 is excessive, resulting in adhesive being applied outside the edge surface 40p of the notch 43b. As a result, the non-conductive adhesive 50 has delaminated.

More specifically, in FIG. 3A the adhesive 50 on the crystal frame 20 does not extend to the edge surface 40p of the notch 43b, which leaves an adhesive-free void 51 between the extraction electrode 35 and the base 40A. Later, when the external electrode 41b is being formed (by sputtering or vacuum deposition), the Cr and Au layers thereof do not form in the void 51, which prevents the electrode portions 42a, 42b from being connected to each other in the void 51, and prevents the external electrode 41b from being electrically connected to the respective extraction electrode 35.

In FIG. 3B too much adhesive 50 has been applied to the crystal frame 20, which causes some adhesive 52 to spread out past the edge surface 40p of the notch 43b. The excess adhesive 52, having a large surface area that is exposed to the external environment, may peel or become cracked if the environment is too dry. Such cracking or peeling causes disconnection of the external electrode 41b, in the vicinity of the excess adhesive 52, from the electrode portions 42c, 42d. Consequently, the external electrode 41b is no longer electrically connected to the extraction electrode 35.

In this embodiment, however, the edge surface 50p of the non-conductive adhesive 50 is substantially flush with the side surfaces 40p of the notches 43a, 43b. As a result, no voids 51 (FIG. 3A) are produced, and there is no stray excess adhesive 52 (FIG. 3B), which allows the extraction electrodes 34, 35 and respective external electrodes 41a, 41b to be connected together firmly without any likelihood of disconnection.

Referring again to FIG. 2, the piezoelectric resonator 100A of the first embodiment has an amount of non-conductive adhesive 50 applied onto the surface of the crystal frame 20 facing the base 40A sufficient just to reach the notches 43a, 43b. The edge surface of the adhesive 50 is formed substantially flush with the side surface 40p of the notch 43b by sand-blasting or anisotropic etching as required. Afterward, the external electrodes 41a, 41b are formed by sputtering or vacuum deposition to cover the edge surfaces 50p of the non-conductive adhesive as well as the extraction electrodes 34, 35.

First Embodiment of Method for Manufacturing Piezoelectric Resonator

Figure 4:
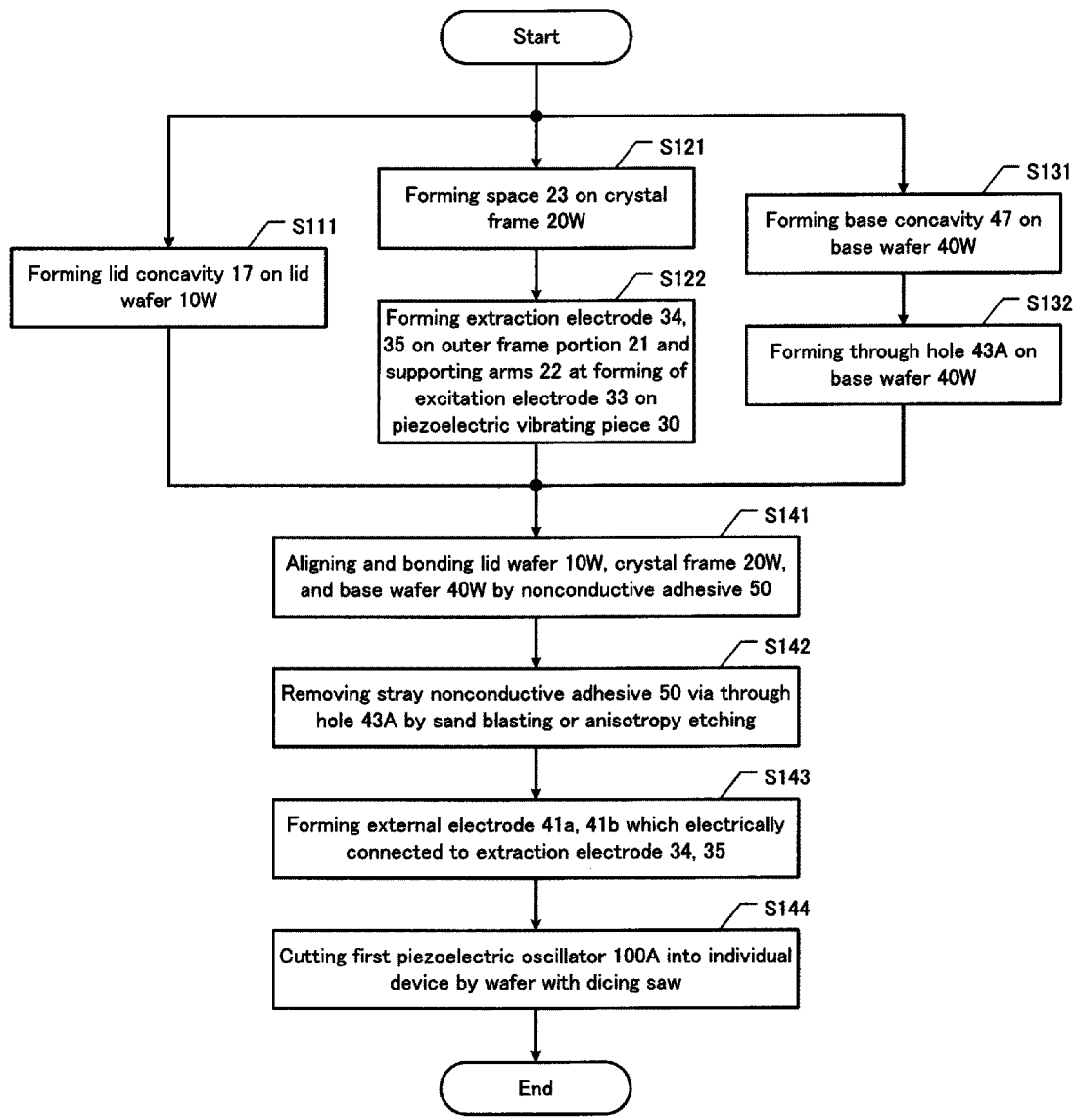
FIG. 4 is a flow-chart of an embodiment of a method for manufacturing the first embodiment of the piezoelectric resonator.
Figure 5:
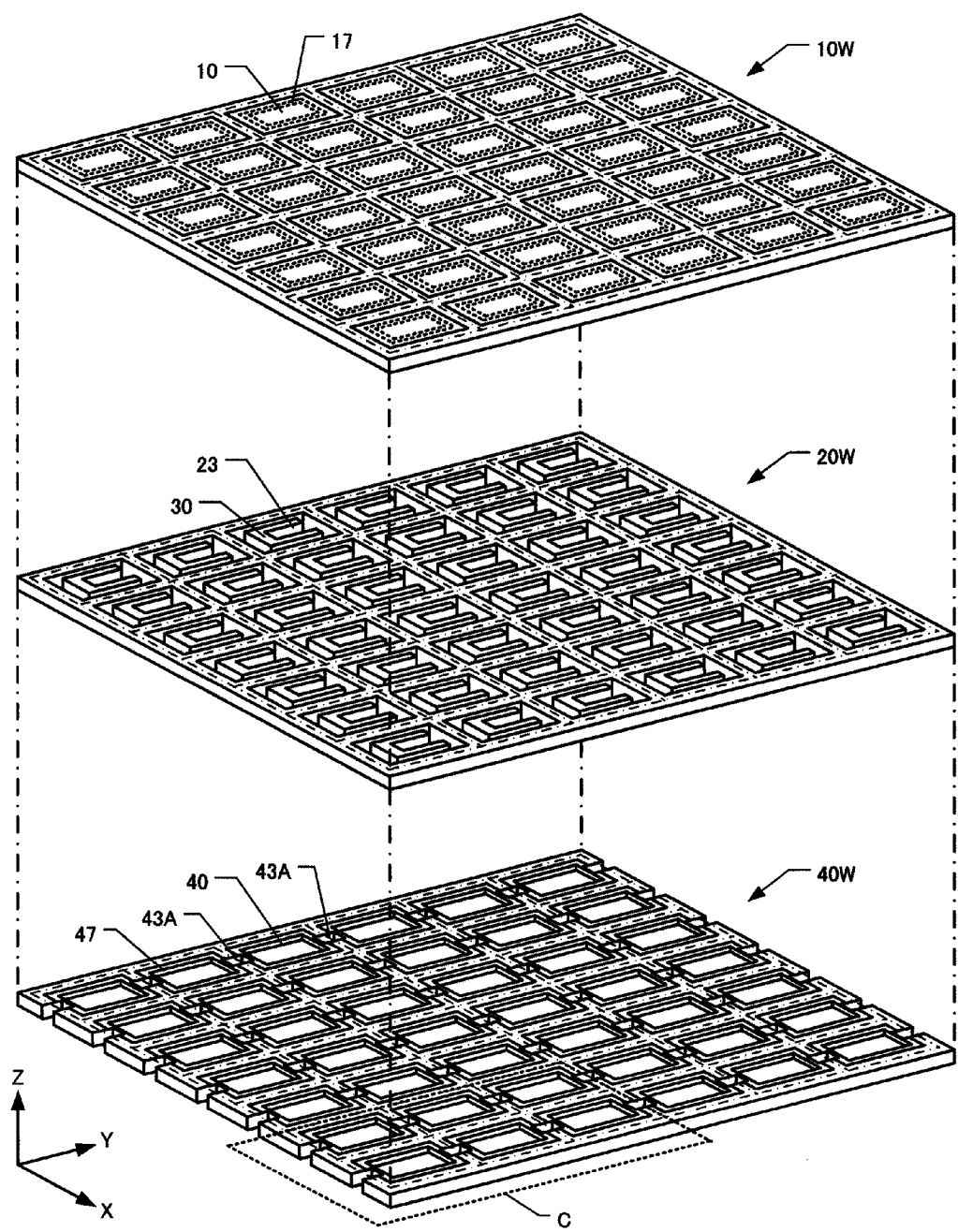
FIG. 5 is a schematic view showing the lid wafer, the crystal wafer, and the base wafer separated from each other but aligned with each other in preparation for bonding the three wafers together.
Figure 6:
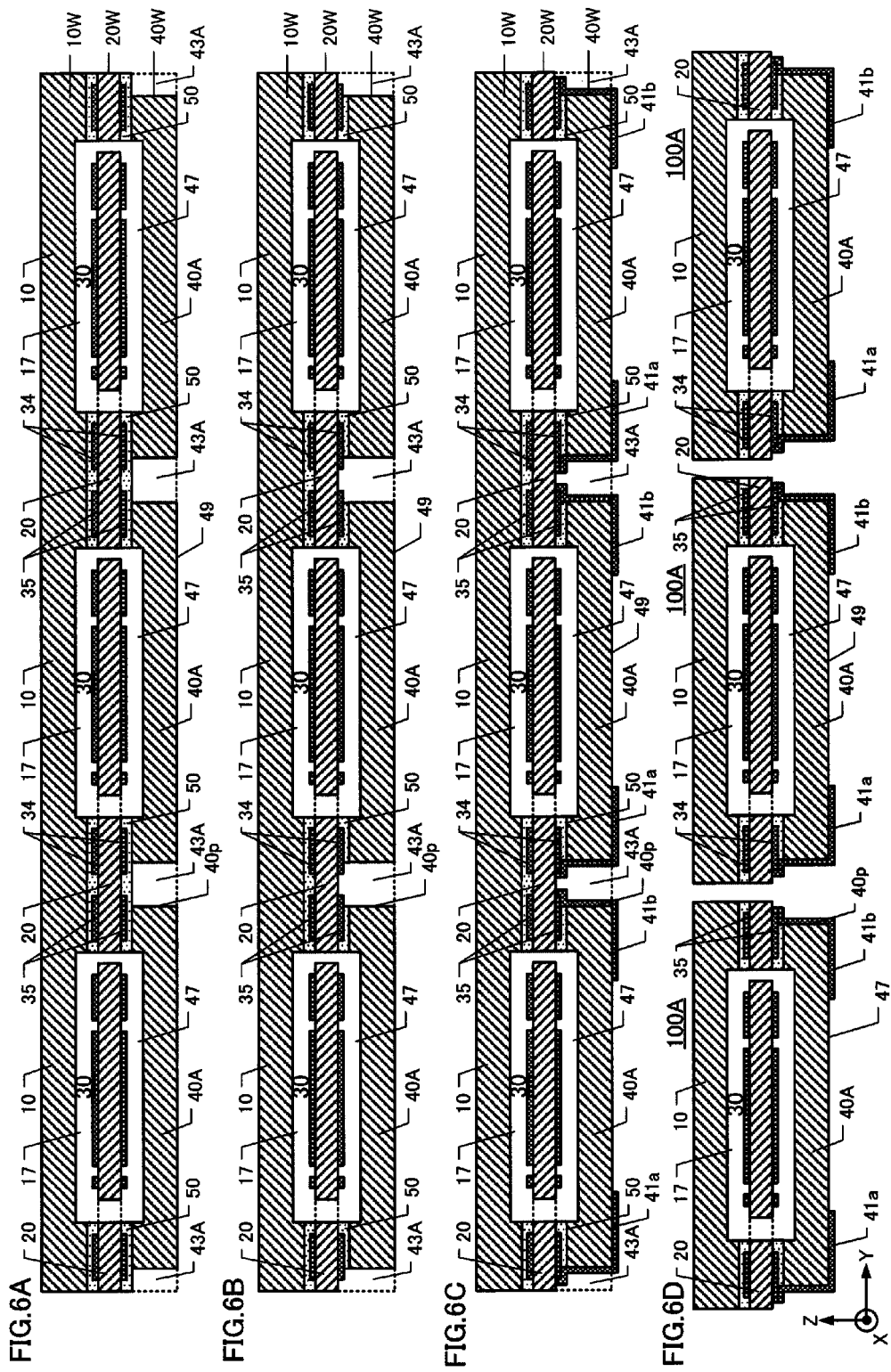
FIGS. 6A-6D are respective cross-sectional views showing the three wafers immediately after being bonded together (FIG. 6A), immediately after trimming the adhesive in the through-holes (FIG. 6B), immediately after forming the external electrodes (FIG. 6C), and immediately after cutting into individual piezoelectric resonators 100A (FIG. 6D).
Figure 7:
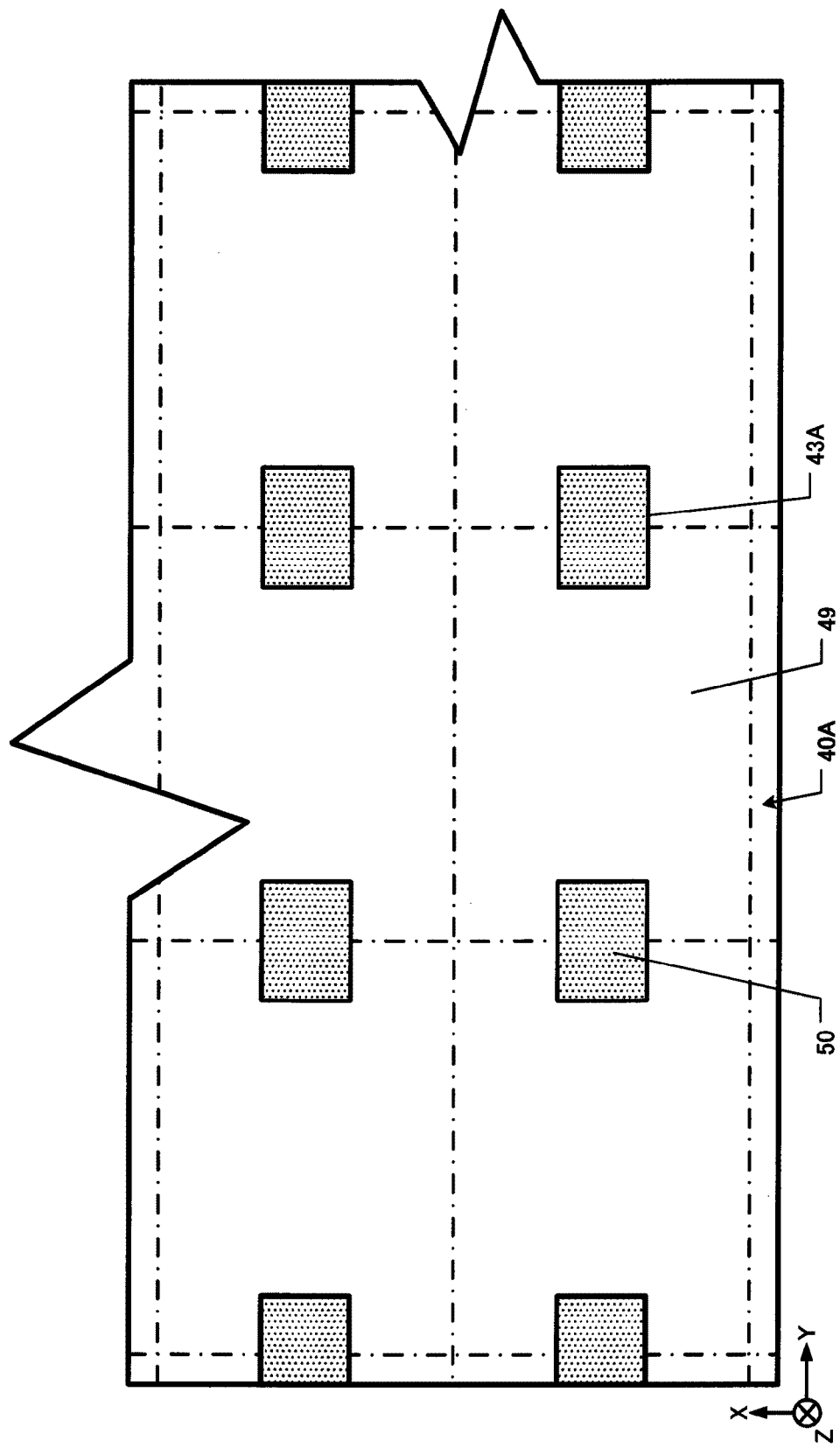
FIG. 7 is a plan view of the bottom surface of the base wafer after the three wafers have been bonded together but before the external electrodes have been formed in the first embodiment.

An embodiment of a method for making the piezoelectric resonator 100A is shown in FIGS. 4-7. FIG. 4 is a flow-chart of the method; FIG. 5 is a schematic view of a lid wafer 10W, crystal wafer 20W, and base wafer 40W aligned with but spatially separated from each other; FIGS. 6A-6D are respective elevational sections showing the bonding together of the three wafers and subsequent cutting of the bonded 3-wafer sandwich into individual piezoelectric resonators 100A; and FIG. 7 is a plan view of the bottom surface 49 of the base wafer 40w after bonding together the 3-wafer sandwich but before forming the external electrodes.

Referring to FIG. 4, in Step S111 the lid wafer 10W is prepared. Steps S121, S122 involve preparing the crystal wafer 20W, and steps S131, S132 involve preparing the base wafer 40W. These steps can be performed separately, in parallel or otherwise. Steps S141 and subsequent thereto involve layering the three wafers.

In step S111, a lid wafer 10W comprising multiple lids 10 is prepared. As shown in FIG. 5, hundreds or thousands of lids 10, each having a respective lid concavity 17, are formed simultaneously on the lid wafer 10W. If the lid wafer 10W is made of glass, for example, the lid concavity 17 can be formed by etching or machine processing.

In step S121 the crystal wafer 20W defining multiple crystal frames 20 is formed. As shown in FIG. 5, hundreds or thousands of crystal frames 20 are formed simultaneously on each crystal wafer 20W. Each crystal frame 20 has a respective tuning-fork type crystal vibrating piece 30 and supporting arms 22 formed by wet-etching the crystal wafer 20W.

In step S122, as shown in FIG. 1, the excitation electrodes 33 are formed on each tuning-fork type crystal vibrating piece 30, and excitation electrodes 34, 35 are formed on the frame portion 21 and supporting arms 22. Then, the Cr and Au layers are formed on respective electrodes by sputtering or vacuum deposition. The extraction electrodes 34, 35 extend to respective positions corresponding to the through-holes 43A in the base wafer 40W.

In step S131 the base wafer 40W is prepared. As shown in FIG. 5, hundreds or thousands of bases 40A are formed on one base wafer 40W. If the material of the base wafer 40W is glass, the concavity 47 in each base is formed by etching or machine processing.

In step S132 through-holes 43A are formed that extend fully through the thickness (Z-axis direction) of the base wafer 40W. The through-holes 43A are located at respective positions corresponding to locations of the extraction electrodes 34, 35 formed on the crystal frame 20 (see FIG. 1). The desired shape of the through-holes 43A is rectangular. Each through-hole 43A corresponds to the notches 43a, 43b formed on the respective two adjacent bases 40A (see FIG. 1).

In step S141 the lid wafer 10W, the crystal wafer 10W, and the base wafer 40W are aligned with each other, sandwiched, and bonded together using the non-conductive adhesive 50 (see FIG. 6). Bonding is conducted in a vacuum condition or in an inert atmosphere. Thus, the cavity (i.e., interior space defined in part by the lid concavity 17 and the base concavity 47) is evacuated or provided with an inert gas atmosphere. A predetermined controlled amount of the non-conductive adhesive 50 is applied between the crystal wafer 20W and the base wafer 40W. The amount is sufficient to cover the respective portions of the extraction electrodes 34, 35 that are exposed (bare) in the through-holes 43A. The exposed portions have respective areas equal to the areas (or to predetermined portions thereof) of the respective through-holes 43A.

In step S142, after the lid wafer 10W, the crystal wafer 20W, and the base wafer 40W are bonded together, the condition of the bottom surface 49 of the base 40A is as shown in FIG. 7. Some non-conductive adhesive 50 is situated on the bottom surface of each through-hole 43A. The non-conductive adhesive 50 on the bottom surfaces of the through-holes 43A is removed by sand-blasting or anisotropic etching. Anisotropic etching can be performed by argon-ion irradiation or by $O_2$ plasma irradiation. During this limited removal of conductive adhesive 50, portions of extraction electrodes 34, 35 that were covered by the non-conductive adhesive 50 at the bottoms of the through-holes may also be removed. However, because the hardness of the non-conductive adhesive 50 is substantially less than of the extraction electrodes 34, 35, only a small amount of material of the extraction electrodes 34, 35 is removed, compared to the amount of non-conductive adhesive that is removed. To achieve such results consistently, the conditions under which the sand-blasting or irradiation are conducted are well-controlled.

Sand-blasting or irradiation is performed so that the remaining exposed surfaces of the non-conductive adhesive 50 are co-topographic with the side surfaces 50p of the notches 43a, 43b. As a result, he the extraction electrodes 34, 35 and external electrodes 41a, 41b are electrically connected together firmly without any disconnection.

In step S143, the results of which are shown in FIG. 6C, the external electrodes 41a, 41b are formed so as to cover at least the bottom surface 49 of the base 40A, at least the side surface 50p of at the adhesive 50, and the extraction electrodes 34, 35. A mask (not shown) is placed or formed on the bottom surface 49 of the base 40A. An area of the mask corresponding to the location and area of the external electrode 41b is open on the mask so that the Cr is selectively deposited through the opening by sputtering or vacuum deposition, followed by controlled deposition of Au. Then, the mask is removed from the bottom surface 49.

In step S144, the results of which are shown in FIG. 6D, the bonded three-wafer sandwich is cut using a dicing saw along the dashed lines using a dicing saw as shown in FIG. 5 or FIG. 7, thereby completing fabrication of individual piezoelectric resonators 100A. The resonators 100A are resistant to disconnections between the external electrodes 41a, 41b and the extraction electrodes 34, 35.

Second Embodiment of Piezoelectric Resonator

A piezoelectric resonator 100B according to this embodiment is described below with reference to FIGS. 8 and 9. In the description of this embodiment, the same reference numerals are used to denote respective components that are similar to corresponding components in the first embodiment.

Figure 8:
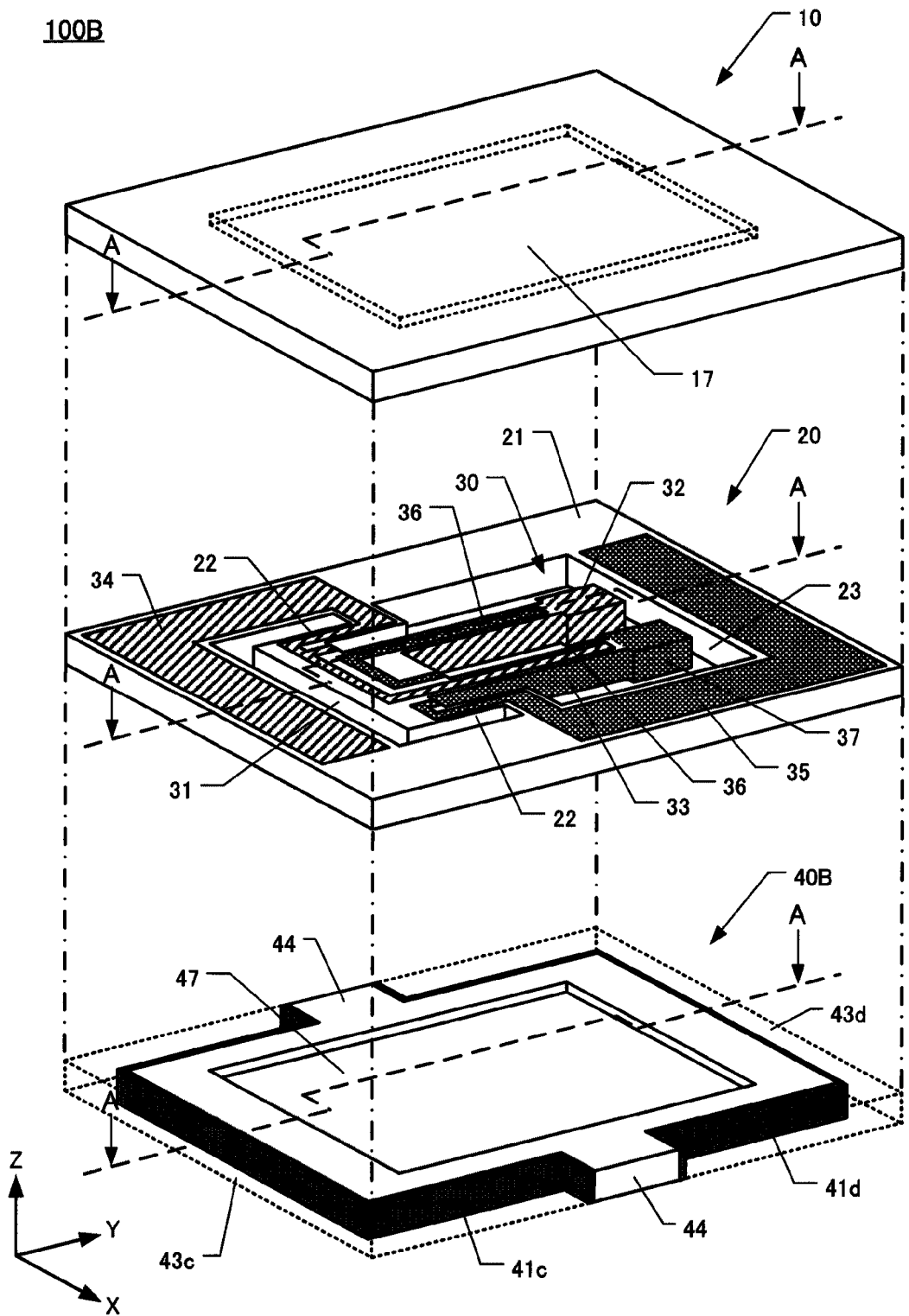
FIG. 8 is an exploded schematic view of a second embodiment of a piezoelectric resonator (piezoelectric vibrating device).
Figure 9A:
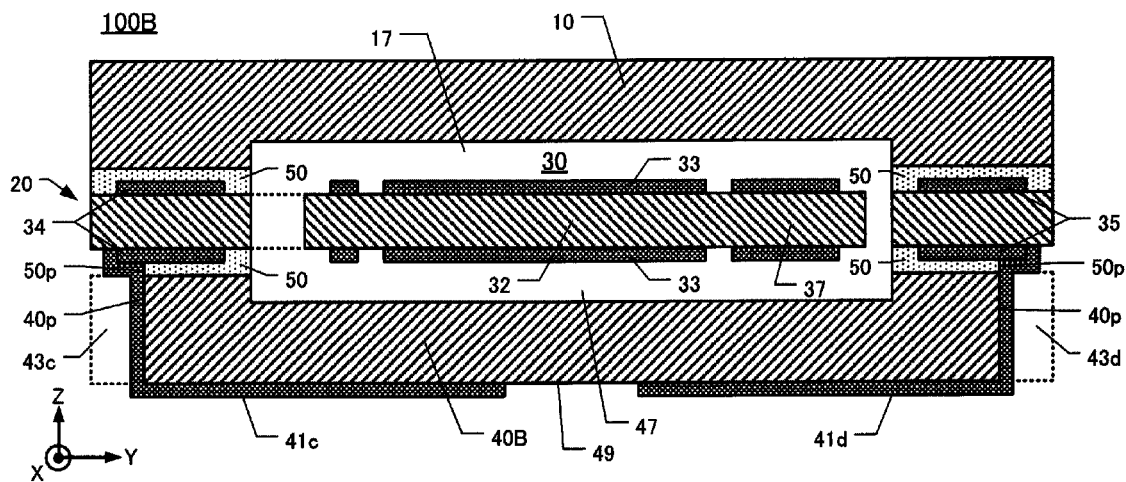
FIG. 9A is an elevational section along the line A-A in FIG. 8 of the second embodiment of a piezoelectric resonator.
Figure 9B:
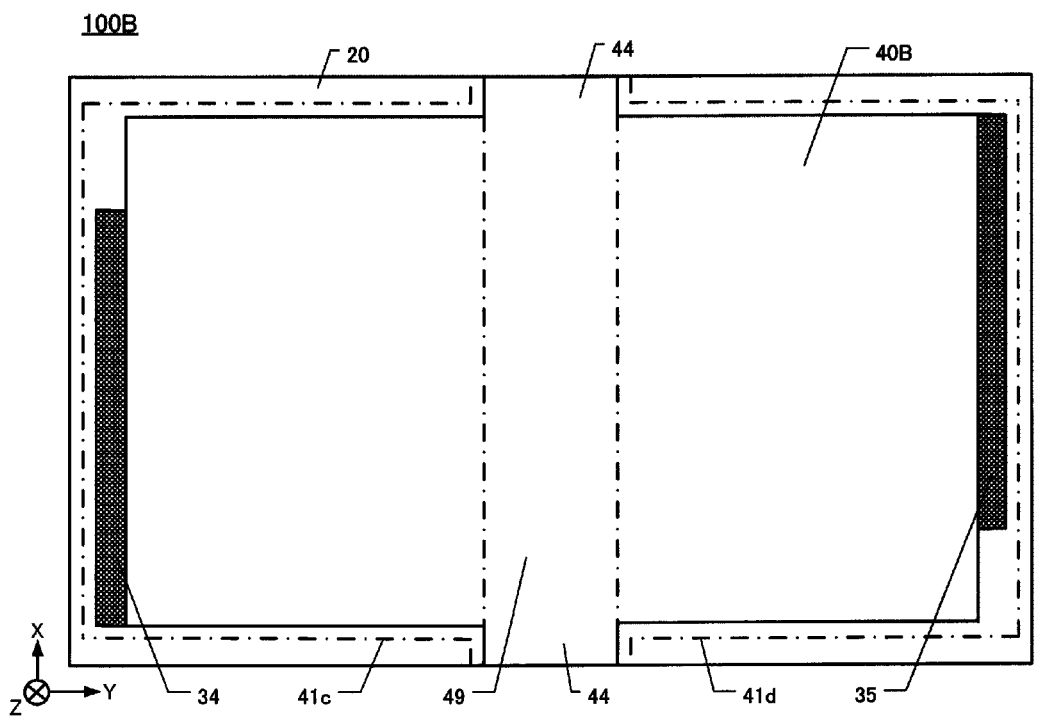
FIG. 9B is a plan view of the bottom surface of the piezoelectric resonator according to the second embodiment, in which the external electrodes are delineated using dash-dot lines to show underlying structure.

FIG. 8 is an exploded-schematic view of a piezoelectric resonator 100B of this embodiment. FIG. 9A is an elevational section along the line A-A in FIG. 8. FIG. 9B is a view of the bottom surface 49 of the piezoelectric resonator 100B of this embodiment, in which the external electrodes 41c, 41d are delineated using respective dot-dash lines. In FIG. 8 the piezoelectric resonator 100B has basically the same three-layer structure as the piezoelectric resonator 100A of the first embodiment. The lid 10 and the crystal frame 20 are similar to respective components of the first embodiment. In FIG. 8 the base 40B has a base concavity 47 that faces the crystal frame 20 as in the first embodiment.

In FIG. 8 the dotted lines around the base 40B denote regions that, together with opposing projections 44, correspond to the periphery of the lid 10 or of the crystal frame 20 in the XY plane. These regions constitute an opposing pair of recesses 43c, 43d that are analogous to the notches in the first embodiment. I.e., the recesses 43c, 43d are respective parts of H-shaped through-holes 43B (see FIG. 10) formed between adjacent bases 40B defined on a base wafer 20W. Since each through-hole 434b forms two recesses 43c, 43d, the width dimensions of the recesses 43c, 43d on the XY plane are one-half the dimension of the corresponding width dimensions in the through-hole 43B.

Referring further to FIG. 8, the recesses 43c and 43d are not connected together in the Y-axis direction on the XY plane. This is a result of the opposing pair of projections 44 that extend in the X-axis direction. The respective projections 44 of adjacent bases 40 B in the X-axis direction are connected to one another on the base wafer 40B.

In FIGS. 8 and 9A, the lid 10 and crystal frame 20 are bonded together using the non-conductive adhesive 50. The crystal frame 20 and the base 40B are also bonded together using the non-conductive adhesive 50. External electrodes 41c, 41d are formed on respective regions of the base 40B. Associated with the external electrodes 41c, 41d are respective recesses 43c, 43d formed at respective ends (in the Y-axis direction) of the base 40B. Respective extraction electrodes 34 are formed on the frame portion 21 of the crystal frame 20, each extending with an L-shape over respective portions of the frame portion 21. The first external electrode 41c extends on the bottom surface 49 of the base 40B to align with the respective recess 43c and with the respective extraction electrode 34. Similarly, the second external electrode 41d extends on the bottom surface 49 of the base 40B to align with the respective recess 43d and with the respective extraction electrode 34. A portion of the first external electrode 41c also extends, in the +Z-axis direction, on the edge surface 40p of the recess 43c, and a portion of the second external electrode 41d extends, in the +Z-axis direction, on the edge surface 40p of the recess 43d. The external electrodes 41c, 41d are formed by sputtering or vacuum deposition. They cover respective portions of the bottom surface 49 of the base 40B, the edge surfaces 40p of the recesses 43c, 43d, the edge surfaces 50p of the non-conductive adhesive 50, and respective extraction electrodes 34, 35. As shown in FIG. 9B, a portion of the external electrode 41c is electrically connected to the extraction electrode 34 on the crystal frame 20, and a portion of the external electrode 41d is electrically connected to the extraction electrode 35 on the crystal frame 20.

The edge surfaces of the recesses 43c, 43d are co-topographical with the respective edge surfaces 50p of non-conductive adhesive 50. This allows the extraction electrodes 34, 35 to be electrically connected soundly with the respective external electrodes 41c, 41d. The reason for these sound connections was explained in the description of the first embodiment, with reference to FIG. 3.

The edge surfaces 50p of non-conductive adhesive 50 extend along both edge surfaces of the recesses 43c, 43d in the X-axis direction and along both edge surfaces of the recesses in the Y-axis direction of the base 40B. The edge surface 50p of the adhesive 50 is covered by respective external electrodes 41c, 41d except in regions occupied by the projections 44. Thus, since the edge surfaces 50p of the non-conductive adhesive 50 are not exposed to the environment, possible environmental damage to these edge surfaces 50p (e.g., by corrosion) is prevented.

The external electrodes 41c, 41d of this embodiment comprises a Au layer of 400 Å to 2000 Å thickness formed on a Cr layer of 150 Å to 700 Å thickness. The external electrodes have high adhesion to glass. Instead of Cr, nickel (Ni) or titanium (Ti) can be used, and silver (Ag) can be used instead of Au.

FIG. 10 is a view of the bottom surface 49 of the base wafer 40W of the bonded three-wafer sandwich before formation of the external electrodes 41c, 41d. The recesses 43c, 43d of adjacent bases 40B define each through-hole 43B. Consequently, the through-hole 43B has an "H" shape and extend at least in part along three edges of each base. Adjacent through-holes 43 are formed with a predetermined distance D between them. The distances D define respective connecting frames 45 on the base wafer.

Second Embodiment of Manufacturing Method

This embodiment of a method for manufacturing the second embodiment 100B of a piezoelectric resonator is described below with reference to FIG. 4. In step S111 a lid wafer 10W defining an array of multiple lids 10 is prepared.

In step S112 a crystal wafer 20W is prepared defining an array of multiple crystal frames 20 is prepared. In step S122, as shown in FIG. 1, excitation electrodes are formed on the tuning-fork type crystal vibrating piece 30 and the extraction electrode 34, 35 are formed on the outer frame portion 21 and the supporting arms 22. In step S131, a base wafer 40W having second bases 40B is prepared.

In step S132, the through-holes 43B in the base wafer 40W are formed in regions corresponding to the extraction electrodes 34, 35 formed on the crystal frame 20. Each through-hole 43B has an "H" shape, as shown in FIG. 10, when viewed from above. Each through-hole 43B includes the recesses 43c, 43d (see FIG. 8) formed on adjacent bases 40B. Thus, on the base wafer 40B, multiple bases 40B are formed, connected together by projections 44 and connecting frames 45.

In step S141, the lid wafer 10W, the crystal wafer 20W, and the base wafer 40W are aligned with each other and bonded together using the non-conductive adhesive 50 in a vacuum or inert-gas atmosphere. A sufficient amount of the non-conductive adhesive 50 is applied to cover the extraction electrodes 34, 35 (see FIG. 8) exposed to the area of the through-hole 43B. The non-conductive adhesive 50 desirably is applied in a sufficient amount to cover all or a part of the extraction electrodes 34, 35 (see FIG. 8) left bare in the through-hole 43B.

In step S142, after the lid wafer 10W, crystal wafer 20W, and base wafer 40W have been bonded together, the condition of the bottom surface 49 of the base 40B is as shown in FIG. 10. Non-conductive adhesive 50 has been applied to the bottom surface of the though-hole 43B, from which the non-conductive adhesive 50 can be removed by sand-blasting or anisotropic etching. Anisotropic etching can include removal of material by irradiating with argon ions or $O_2$ plasma. Whenever portions of the non-conductive adhesive 50 are removed in this manner, corresponding regions of the extraction electrodes 34, 35 covered by the non-conductive adhesive 50 may be also removed. However, because the non-conductive adhesive 50 is substantially softer than the material of the extraction electrodes 34, 35, very little material of the extraction electrodes 34, 35 is removed so long as the sand spray rate or argon-ion irradiation dose is controlled.

As a result of the foregoing steps, the edge surfaces of the adhesive 50 are co-topographic with the edge surfaces of the recesses 43c, 43d. This allows the extraction electrodes 34, 35 and respective external electrodes 41a, 41b to be connected together soundly without any significant risk of disconnection.

In step S143 the external electrodes 41c, 41d are formed so as to cover respective regions of the bottom surface 49 of the base 40B, the edge surfaces 50p of the adhesive 50, and the extraction electrodes 34, 35. A mask (not shown) is formed or placed on the bottom surface 49 of the base 40B. In the mask an area corresponding to the external electrode 41d is open so that Cr can be deposited in the area on the bottom surface by sputtering or vacuum deposition, followed by deposition of Au. Then, the mask is removed from the bottom surface 49.

In step S144 the bonded three-wafer sandwich is cut along the dashed lines using a dicing saw (not shown). FIG. 11 is a view of the bottom surface 49 of the base wafer 40W after the external electrodes 41c, 41d have been formed. As shown in FIG. 11, multiple through-holes 43B are formed (spaced apart from each other a predetermined distance D in the X-axis direction), so that it is necessary to cut within the predetermined distance D when making the cuts along the Y-axis direction.

Thus, production of the piezoelectric resonator 100B is completed, in which the external electrodes 41c, 41d and respective extraction electrodes 34, 35 are soundly connected together electrically.

In the foregoing description, the lid and the base are made of glass; but, quartz or other crystal material can be used instead of glass. Making the lid and base of a crystal is desirable for the following reason: One of the indicators of hardness of an industrial material is the "Knoop hardness." A higher Knoop hardness number indicates greater hardness, and a lower number indicates greater softness. The Knoop hardness number of borosilicate glass (commonly used for making lids and bases) is 590 kg/mm2, and the Knoop hardness number of quartz crystal is 710 to 790 kg/mm2. Thus, making the lids and bases of crystal instead of glass produces vibrating devices having a higher degree of hardness. If the lids and bases are made of glass, the thickness of glass would have to be correspondingly thicker to meet a designated degree of hardness and strength. But, when fabricated of crystal, these components can be made with a thinner profile while achieving the same strength and hardness. I.e., in fabricating piezoelectric devices in which the lids and bases are made of crystal instead of glass, devices having the same strength and hardness as obtained when they are made of glass can be made that are more miniaturized and thinner than if they were made of glass.

Whenever a piezoelectric resonator is being manufactured or being mounted to a printed circuit board, heat is normally applied to the resonator. If a material other than crystal is used for making the lid and base, the interior of the piezoelectric resonator may become excessively stressed due to differences in the respective thermal expansion coefficients of the crystal frame versus of the lid and base. Greater stress can cause fracture of the corners of the outer frame portion of the crystal frame, which tend to have lower stress intensity than other regions. Thus, it is desirable to narrow the differences in respective thermal expansion coefficients of the lid and base versus the crystal frame. The resulting narrowing of the differences in thermal expansion coefficient substantially reduces stresses in the interior of the piezoelectric resonator. Moreover, using crystal facilitates miniaturization or achievement of a thinner profile of the piezoelectric resonator.

While example embodiments have been described of the present invention, it will be understood by those of skill in the art that various changes in form and details may be made therein without departing from the spirit and scope of the following claims.

For example, the present invention can be applied to an AT-cut vibrating piece instead of the tuning-fork type crystal vibrating piece. Further for the piezoelectric resonator, any of various piezoelectric single-crystal materials, such as lithium niobate, can be used instead of quartz crystal. Moreover, the present invention can be applied to a piezoelectric resonator comprising an IC incorporated oscillation circuit formed on its base. The invention can also be applied to MEMS (micro electro mechanical systems) or other electrical packages.

What is claimed is:

1. A method for manufacturing a piezoelectric device, comprising:
   preparing a base wafer defining an array of multiple bases, in which array at least one respective through-hole is defined between the adjacent bases, each through-hole extending through a thickness dimension of the base wafer;
   preparing a piezoelectric wafer defining an array of multiple piezoelectric frames corresponding to the array of bases, each of the piezoelectric frames comprising a respective piezoelectric vibrating piece, a respective frame portion including a surface that is alignable with and bondable to the respective base, at least one respective excitation electrode, and at least one respective extraction electrode, each of the extraction electrodes having a portion that is located on the surface of the respective frame portion, that is electrically connected to a respective excitation electrode, and that extends to the respective through-hole whenever the base wafer is aligned with and bonded to the piezoelectric wafer;
   on each of the piezoelectric frames, applying an adhesive to the surface of the respective frame portion facing the respective base, the surface including a corresponding surface of the respective extraction electrode;
   aligning the piezoelectric wafer with the base wafer and bringing the wafers together to contact corresponding surfaces of the base wafer with the adhesive;
   curing the adhesive to bond the piezoelectric wafer and the base wafer together, thereby providing each of the through-holes with a bottom defined by the surface of the respective frame portion;
   removing adhesive from the bottom of each of the through-holes to produce an edge surface of the adhesive and expose a portion of the respective extraction electrode situated at the bottom of the through-hole; and
   on an outer surface of each base, forming a respective external electrode for each of the extraction electrodes such that the external electrode is electrically connected to the respective extraction electrode by extending into the respective through-hole and covering the edge surface of the adhesive and the exposed portion of the respective extraction electrode.

2. The method of claim 1, further comprising:
   preparing a lid wafer defining an array of multiple lids corresponding to the array of bases; and
   bonding the piezoelectric wafer and the lid wafer together using the adhesive, thereby forming a three-wafer sandwich.

3. The method of claim 2, further comprising, after bonding the lid wafer, cutting the three-wafer sandwich to separate individual piezoelectric devices from the sandwich and from each other.

4. The method of claim, 1, wherein:
   the base wafer has a bottom surface; and
   each of the through-holes has a rectangular shape as viewed on the bottom surface of the base wafer.

5. The method of claim 4, further comprising:
   preparing a lid wafer defining an array of multiple lids corresponding to the array of bases; and
   bonding the piezoelectric wafer and the lid wafer together using the adhesive, thereby forming a three-wafer sandwich.

6. The method of claim 5, further comprising, after bonding the lid wafer, cutting the three-wafer sandwich to separate individual piezoelectric devices from the sandwich and from each other.

7. The method of claim 4, wherein removing the adhesive is by sand-blasting or anisotropic etching, or both.

8. The method of claim 7, wherein anisotropic etching comprises irradiation by argon ion or $O_2$ plasma.

9. The method of claim 7, further comprising:
   preparing a lid wafer defining an array of multiple lids corresponding to the array of bases; and
   bonding the piezoelectric wafer and the lid wafer together using the adhesive, thereby forming a three-wafer sandwich.

10. The method of claim 1, wherein
the bottom surface of each base is rectangularly shaped; and
each of the through-holes extends along three edges of the base.

11. The method of claim 10, further comprising:
preparing a lid wafer defining an array of multiple lids corresponding to the array of bases; and
bonding the piezoelectric wafer and the lid wafer together using the adhesive, thereby forming a three-wafer sandwich.

12. The method of claim 11, further comprising, after bonding the lid wafer, cutting the three-wafer sandwich to separate individual piezoelectric devices from the sandwich and from each other.

13. The method of claim 10, wherein removing the adhesive is by sand-blasting or anisotropic etching, or both.

14. The method of claim 13, wherein anisotropic etching comprises irradiation by argon ion or $O_2$ plasma.

15. The method of claim 1, wherein removing the adhesive is by sand-blasting or anisotropic etching, or both.

16. The method of claim 15, further comprising:
preparing a lid wafer defining an array of multiple lids corresponding to the array of bases; and
bonding the piezoelectric wafer and the lid wafer together using the adhesive, thereby forming a three-wafer sandwich.

17. The method of claim 16, further comprising, after bonding the lid wafer, cutting the three-wafer sandwich to separate individual piezoelectric devices from the sandwich and from each other.

18. The method of claim 15, wherein anisotropic etching comprises irradiation by argon ion or $O_2$ plasma.

* * * * *